US009116198B2

(12) United States Patent
Cai et al.

(10) Patent No.: US 9,116,198 B2
(45) Date of Patent: Aug. 25, 2015

(54) PLANAR THREE-AXIS MAGNETOMETER

(71) Applicant: MEMSIC, INC., Andover, MA (US)

(72) Inventors: Yongyao Cai, Acton, MA (US);
Jiaoming Qiu, N. Maple Grove, MN (US); Leyue Jiang, Jiangsu (CN)

(73) Assignee: MEMSIC, INC., Andover, MA (US)

( * ) Notice: Subject to any disclaimer, the term of this patent is extended or adjusted under 35 U.S.C. 154(b) by 159 days.

(21) Appl. No.: 13/740,927

(22) Filed: Jan. 14, 2013

(65) Prior Publication Data
US 2013/0265039 A1   Oct. 10, 2013

Related U.S. Application Data

(60) Provisional application No. 61/597,368, filed on Feb. 10, 2012.

(51) Int. Cl.
*G01R 33/02* (2006.01)
*G01R 33/09* (2006.01)

(52) U.S. Cl.
CPC ............ *G01R 33/093* (2013.01); *G01R 33/098* (2013.01); *G01R 33/09* (2013.01)

(58) Field of Classification Search
CPC ...... G11B 5/3903; G11B 5/3906; G11B 5/39; G11B 5/398; G11B 2005/0016; G01R 33/093; G01R 33/098; G01R 33/09; G01R 33/091; H01L 43/03; H01L 43/12; H01F 41/32; B82Y 25/00
USPC ............ 324/207.21, 228, 232, 244, 249, 252, 324/301; 360/110–112, 313–316, 360/327.1–327.11, 322, 324.11–324.12, 360/325, 327.22, 119.1, 123.28; 365/158; 338/32 R
See application file for complete search history.

(56) References Cited

U.S. PATENT DOCUMENTS

| | | | | |
|---|---|---|---|---|
| 5,247,278 A * | 9/1993 | Pant et al. | ................... | 338/32 R |
| 5,898,546 A * | 4/1999 | Kanai et al. | ................ | 360/324.1 |
| 5,898,548 A * | 4/1999 | Dill et al. | ................... | 360/324.2 |
| 5,978,182 A * | 11/1999 | Kanai et al. | ................ | 360/324.1 |
| 5,991,125 A * | 11/1999 | Iwasaki et al. | ........... | 360/324.12 |
| 6,054,226 A * | 4/2000 | Takeda et al. | ................. | 428/682 |
| 6,157,525 A * | 12/2000 | Iwasaki et al. | ........... | 360/324.12 |
| 6,166,539 A * | 12/2000 | Dahlberg et al. | ............. | 324/252 |
| 6,252,749 B1 * | 6/2001 | Hayakawa | ..................... | 360/320 |
| 6,278,271 B1 * | 8/2001 | Schott | .......................... | 324/251 |
| 6,529,114 B1 * | 3/2003 | Bohlinger et al. | .......... | 338/32 R |
| 6,545,462 B2 * | 4/2003 | Schott et al. | ............... | 324/207.2 |
| 6,721,141 B1 * | 4/2004 | Attenborough et al. | ...... | 360/324 |

(Continued)

FOREIGN PATENT DOCUMENTS

WO   WO 2005/073744         11/2005
WO   WO 2005/073744 A1 *   11/2005  ............. G01R 33/07

*Primary Examiner* — Patrick Assouad
*Assistant Examiner* — Sean Curtis
(74) *Attorney, Agent, or Firm* — Preti & Flaherty Beliveau & Pachios LLP

(57) ABSTRACT

A multi-axis GMR or TGMR based magnetic field sensor system is disclosed. Preferably a three axis sensor system is provided for sensing magnetic flux along three mutually orthogonal axes, which can be used for magnetic compass or other magnetic field sensing applications. The sensing units are operative to sense X and Y axis magnetic flux signals in the device (XY) plane, while Z axis sensitivity is achieved by use of a continuous ring shaped or octagonal magnetic concentrator that is adapted to convert the Z axis magnetic flux signal into magnetic flux signals in the XY plane.

15 Claims, 10 Drawing Sheets

(56) References Cited

U.S. PATENT DOCUMENTS

| | | | |
|---|---|---|---|
| 6,831,817 B2* | 12/2004 | Hasegawa et al. | 360/324.12 |
| 6,867,952 B2* | 3/2005 | Hasegawa | 360/324.12 |
| 6,943,041 B2* | 9/2005 | Sugita et al. | 438/3 |
| 6,961,222 B2* | 11/2005 | Kishi | 360/321 |
| 7,005,201 B2* | 2/2006 | Hasegawa et al. | 428/811.5 |
| 7,005,958 B2* | 2/2006 | Wan | 338/32 R |
| 7,038,448 B2* | 5/2006 | Schott et al. | 324/251 |
| 7,235,968 B2* | 6/2007 | Popovic et al. | 324/247 |
| 7,280,322 B2* | 10/2007 | Takahashi et al. | 360/324.1 |
| 7,532,436 B2* | 5/2009 | Hinoue et al. | 360/131 |
| 8,150,657 B2* | 4/2012 | Yamashita et al. | 702/189 |
| 8,421,453 B2* | 4/2013 | Bauer | 324/260 |
| 8,486,723 B1* | 7/2013 | Wan et al. | 438/3 |
| 8,518,734 B2* | 8/2013 | Whig et al. | 438/73 |
| 8,928,602 B1* | 1/2015 | Wan | 345/173 |
| 2002/0021124 A1 | 2/2002 | Schott et al. | |
| 2002/0034055 A1* | 3/2002 | Seyama et al. | 360/324.11 |
| 2003/0184921 A1* | 10/2003 | Sugita et al. | 360/324.1 |
| 2004/0004261 A1* | 1/2004 | Takahashi et al. | 257/414 |
| 2004/0101978 A1 | 5/2004 | Linn et al. | |
| 2004/0165319 A1* | 8/2004 | Wan et al. | 360/324.1 |
| 2006/0164080 A1* | 7/2006 | Popovic et al. | 324/244 |
| 2006/0176142 A1* | 8/2006 | Naito et al. | 338/32 R |
| 2008/0052932 A1 | 3/2008 | Xue et al. | |
| 2008/0316654 A1* | 12/2008 | Aiso | 360/324 |
| 2009/0027048 A1* | 1/2009 | Sato et al. | 324/247 |
| 2009/0190264 A1* | 7/2009 | Fukuzawa et al. | 360/246.4 |
| 2009/0271142 A1* | 10/2009 | Yamashita et al. | 702/141 |
| 2009/0309590 A1* | 12/2009 | Kataoka et al. | 324/244 |
| 2010/0072992 A1 | 3/2010 | Bauer | |
| 2011/0074406 A1* | 3/2011 | Mather et al. | 324/252 |
| 2011/0244599 A1* | 10/2011 | Whig et al. | 438/3 |
| 2011/0309829 A1* | 12/2011 | Loreit et al. | 324/252 |
| 2012/0074511 A1* | 3/2012 | Takahashi et al. | 257/427 |
| 2012/0193736 A1* | 8/2012 | Mather et al. | 257/421 |
| 2013/0176022 A1* | 7/2013 | Lee et al. | 324/252 |
| 2013/0299930 A1* | 11/2013 | Paci et al. | 257/422 |

\* cited by examiner

PLANAR THREE-AXIS MAGNETOMETER

CROSS-REFERENCE TO RELATED APPLICATIONS

This application claims the benefit under 35 U.S.C. §119 (e) of U.S. Provisional Patent Application No. 61/597,368, entitled "PLANAR THREE-AXIS MAGNETOMETER," filed on Feb. 10, 2012, which is herein incorporated by reference in its entirety for all purposes.

STATEMENT REGARDING FEDERALLY SPONSORED RESEARCH OR DEVELOPMENT

Not Applicable

BACKGROUND OF THE INVENTION

Multi-axis magnetic sensors or magnetometers, such as three-axis magnetic sensors, are particularly desirable for modern electronic compass applications. However, such devices are usually unable to sense magnetic flux from all three orthogonal axes. For example, conventional magnetoresistive (MR) sensors, such as AMR (anisotropic MR) sensors, GMR (giant MR) sensors, TGMR (tunneling GMR) sensors, and the like, can detect magnetic flux that is parallel to the device plane but cannot detect flux that is perpendicular to the device plane. On the other hand, Hall-effect sensors can sense magnetic flux that is perpendicular to the device plane, i.e., along the Z axis, but cannot sense magnetic flux parallel to the device plane, i.e., in the XY plane.

There are many known approaches to fabricate a magnetic sensor with three-axis sensitivities. One approach is to package a Z axis sensor of the same technology as the X and Y axis sensors in orthogonal disposition to the two-axis XY sensors. Another approach uses two types of sensor technologies that are disposed on a common die with one constructed to sense vertical magnetic flux signals and the other constructed to sense horizontal magnetic flux signals. Multi-axis sensitivities can also be achieved by building sensors on a sloped surface. A further approach uses a magnetic concentrator that is adapted to convert signals along one axis to an orthogonal direction so that magnetic flux from all three axes can be detected using the same technology.

However, there are disadvantages associated with each of the known approaches. For example, combining a Z axis magnetic field sensor, whose sensing direction is perpendicular to the device (XY) plane, with an X or Y axis magnetic field sensor(s) requires one or more additional packaging steps in order to install the Z axis magnetic field sensor vertically without significant angle variation. The additional packaging steps add significant cost to the whole product manufacturing process. Furthermore, variation in the positioning angle complicates signal processing since cross-talk signals from the XY plane are introduced if the Z axis magnetic field sensor in not perfectly vertical.

Hall-effect sensors, which can sense magnetic flux from a direction that is perpendicular to the device (XY) plane, can be built on a common die with two-axis MR sensors; however, the different Hall-effect and MR technologies require different processing steps and resultant fabrication complexity.

Sensors that are disposed on a sloped surface can detect magnetic flux signals that are parallel and perpendicular to the device (XY) plane, but with the disadvantage of a complicated manufacturing process. For example, typical fabrication steps, including film deposition, photolithographic, etch patterning and the like on sloped surfaces, are much more difficult than on planar surfaces, especially as device dimensions become smaller and smaller.

A magnetic concentrator can convert magnetic flux signals along one direction to signals along another direction and can also improve sensitivity through flux signal amplification. However, known concentrator configurations complicate signal processing because of cross-talk which can affect the sensing units.

Therefore, it would be desirable to provide a multiple-axis magnetic sensor or magnetometer having a magnetic concentrator that is less affected by cross-talk.

BRIEF SUMMARY OF THE INVENTION

A multi-axis GMR or TGMR based magnetic field sensor or magnetometer is disclosed. Preferably a planar three axis sensor is provided for sensing magnetic flux along three mutually orthogonal axes. The sensor or magnetometer can be used for magnetic compass or other magnetic field sensing applications. The GMR or TGMR sensing units are operative to sense X and Y axis magnetic flux signals in the device (XY) plane, while Z axis sensitivity is achieved by use of a continuous ring shaped or octagonal magnetic concentrator that is adapted to convert the Z axis magnetic flux signal into magnetic flux signals in the XY plane. The Z field component is calculated using magnetic flux signals from the X or Y axis sensors through signal processing. The magnetic concentrator functions both as a flux guide (Z to XY plane) and a signal amplifier. Cross talk is minimized by placement of the sensor units symmetrically on both sides of the concentrator.

Advantageously, GMR and/or TGMR sensors have higher signal amplitudes when compared to AMR or Hall-effect sensors. In instances in which electronic noise is dominating, higher amplitude is especially beneficial to improve the signal to noise ratio. GMR and TGMR sensors also can be much smaller than AMR based sensors, hence, overall device size can be significantly reduced. In addition, GMR and TGMR sensors can have higher field strength over a greater range, which renders such sensors less susceptible to electromagnetic noise in, for example, a smart phone or other handheld electronic devices.

BRIEF DESCRIPTION OF THE SEVERAL VIEWS OF THE DRAWINGS

Other features and advantages of the invention will be apparent from the following description of the preferred embodiments thereof and from the claims, taken in conjunction with the accompanying drawings, in which:

DETAILED DESCRIPTION OF THE INVENTION

This application claims the benefit under 35 U.S.C. §119 (e) of U.S. Provisional Patent Application No. 61/597,368, entitled "PLANAR THREE-AXIS MAGNETOMETER," filed on Feb. 10, 2012, which is herein incorporated by reference in its entirety for all purposes.

Figure 1A:
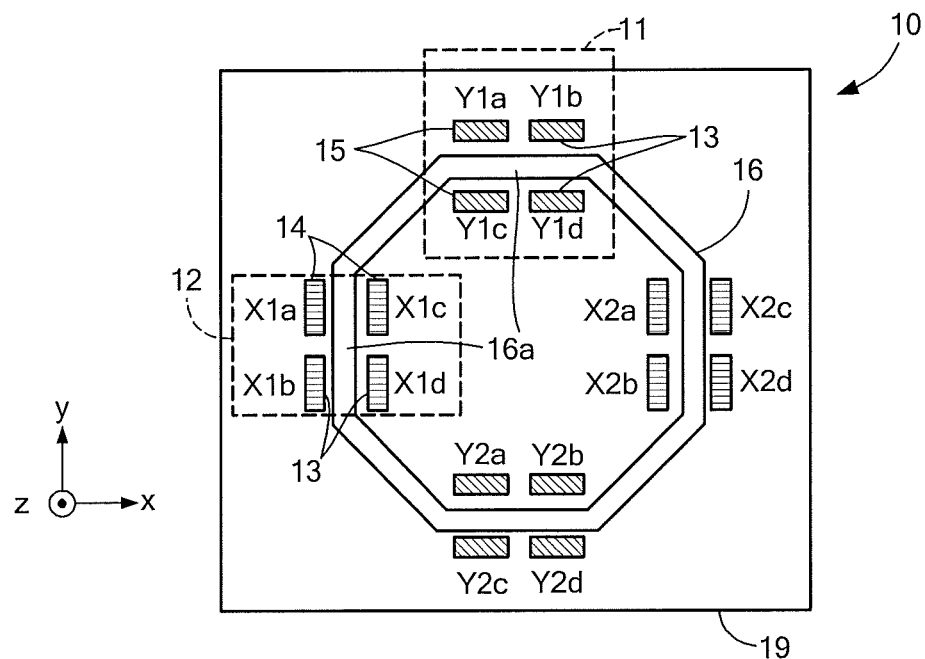
FIG. 1A shows a diagrammatic plan view of a three-axis magnetic field sensor having an octagonal magnetic concentrator in accordance with the present invention.
Figure 1B:
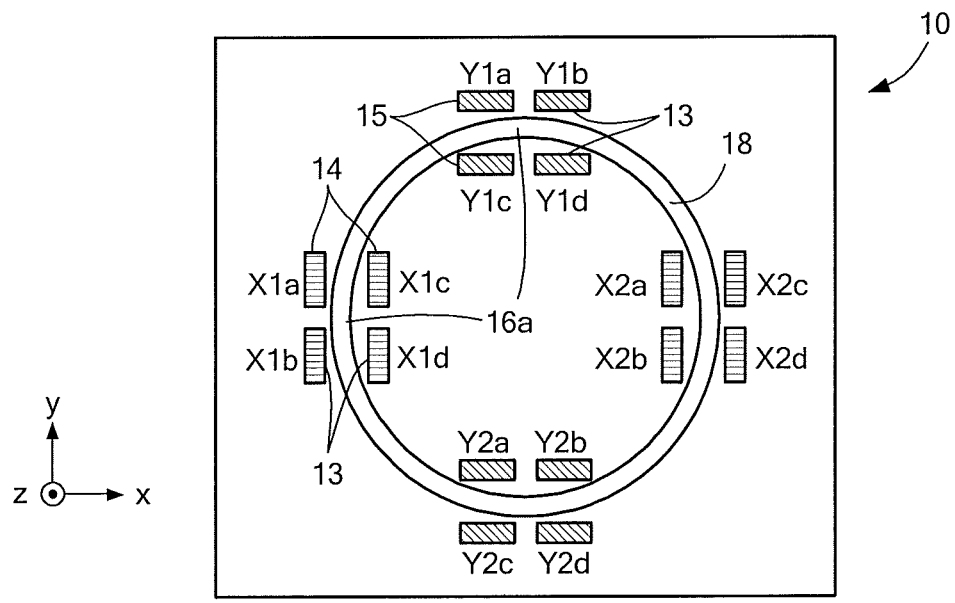
FIG. 1B shows a diagrammatic plan view of a three-axis magnetic field sensor having a ring-shaped magnetic concentrator in accordance with the present invention.

Referring to FIGS. 1A and 1B, magnetometer layouts in accordance with the present invention are shown, respectively, for a system 10 with a continuous octagonal magnetic concentrator 16, and for a system 10 with a continuous, ring-shaped magnetic concentrator 18. The devices of FIG. 1A and FIG. 1B are the same except for the shape of the magnetic concentrator. The magnetic concentrator is formed of a ferromagnetic material having high permeability and low coercive force as per se is known in the art. For illustrative purposes only, each system 10 includes four groups 11, 12 of GMR and/or TGMR units 14, 15 that are disposed at discrete locations about the octagonal 16 or ring-shaped 18 magnetic concentrator. The units 14 and 15 on each side of the magnetic concentrator 16, 18 are structurally identical. Each unit 14, 15 has a rectangular or substantially rectangular shape that is disposed so that the longer side 13 of the rectangle is parallel or substantially parallel to a portion 16a of the adjacent magnetic concentrator. The units 14 and 15 are disposed on opposite sides of concentrator 16 as shown in FIG. 1A, or on opposite sides of concentrator 18 as shown in FIG. 1B.

Each group 11, 12 has four structurally identical units 14, 15 that in operation form a Wheatstone bridge. Groups 11 with the longer sides 13 of units 15 parallel to the X axis become Y axis and Z axis sensors, sensing signals in both the Y and Z axes. Groups 12 with the longer sides 13 of units 14 parallel to the Y axis become X axis and Z axis sensors, sensing signals in both the X and Z axes.

Figures 2A, 2B:
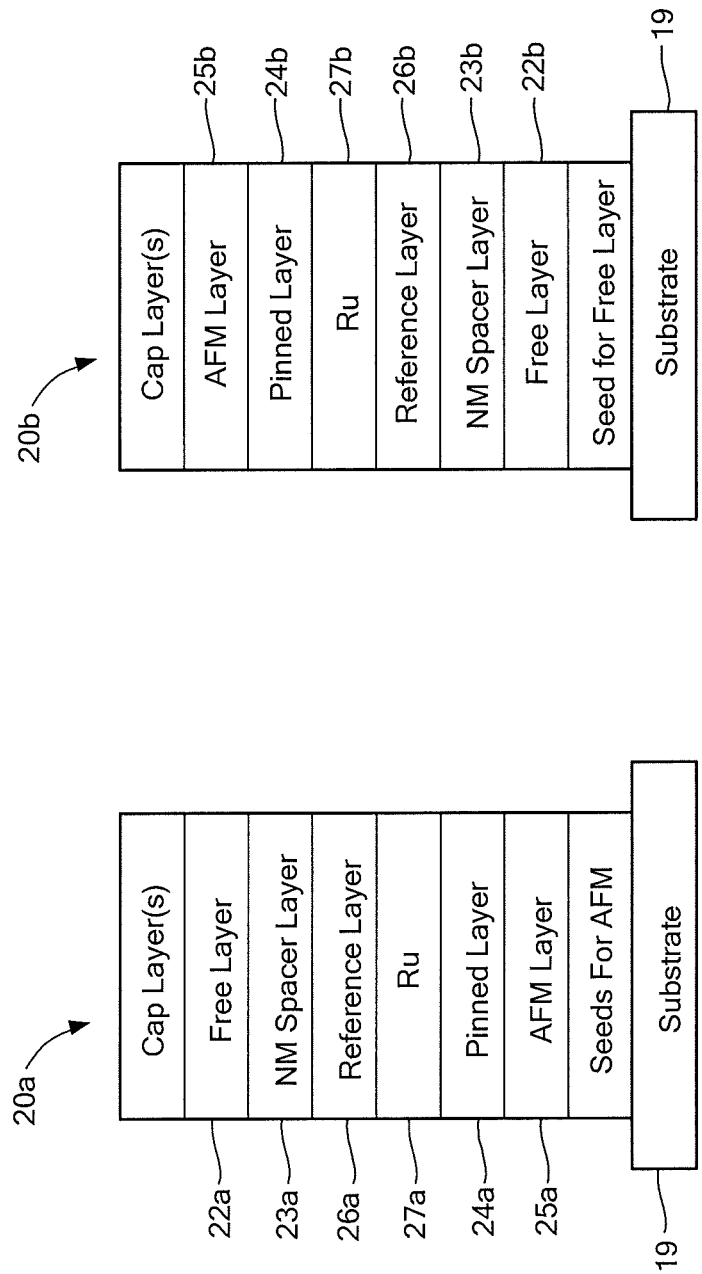
FIGS. 2A and 2B show diagrammatic elevation views of a bottom-pinned and a top-pinned GMR and TGMR sensor, respectively, in accordance with the present invention.

Each of the sensor units 14, 15 are constructed as shown diagrammatically in FIG. 2A and FIG. 2B. A structure for a bottom-pinned unit is shown in FIG. 2A, and for a top-pinned unit is shown in FIG. 2B. The bottom-pinned unit 20a FIG. 2A has an anti-ferromagnetic layer (AFM) 25a at the bottom of the unit 20a, closer to the substrate 19 than the pinned layer 24a, for pinning the pinned layer 24a. The top-pinned unit 20b of FIG. 2B has an anti-ferromagnetic layer (AFM) 25b at the top of the unit 20b further from the substrate 19 than the pinned layer 24b, for pinning the pinned layer 24b.

A ruthenium (Ru) layer 27a, 27b is provided between a reference layer 26a, 26b and the pinned layer 24a, 24b. Adjusting the thickness of the Ru layer 27a, 27b between the reference layer 26a, 26b and the pinned layer 24a, 24b creates a synthetic anti-ferromagnetic (SAF) structure in which the magnetization directions in the reference layer 26a, 26b and the pinned layer 24a, 24b are anti-parallel.

A non-magnetic (NM) spacer layer 23a, 23b is disposed between the free layer 22a, 22b and the reference layer 26a, 26b. If the spacer layer 23a, 23b is a nonmagnetic (NM) insulator, e.g., MgOx, AlOx, and the like, then the device 20a, 20b is a TGMR sensor. If the spacer layer 23a, 23b is a nonmagnetic (NM) metal, e.g., copper, and the like, then the device 20a, 20b is a GMR based device.

Figure 3:
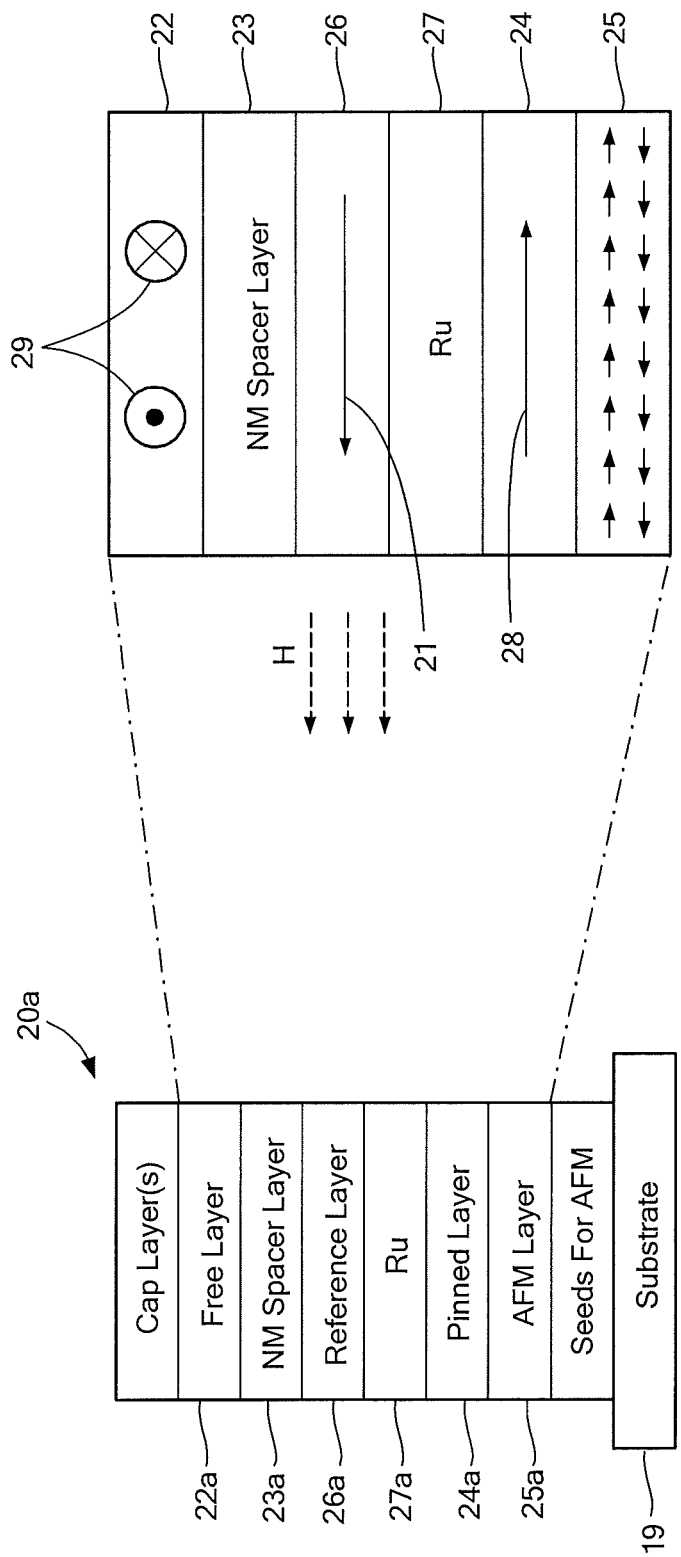
FIG. 3 shows a diagrammatic view of the magnetization structure of the bottom-pinned GMR and TGMR sensor shown in FIG. 2A.
Figure 8:
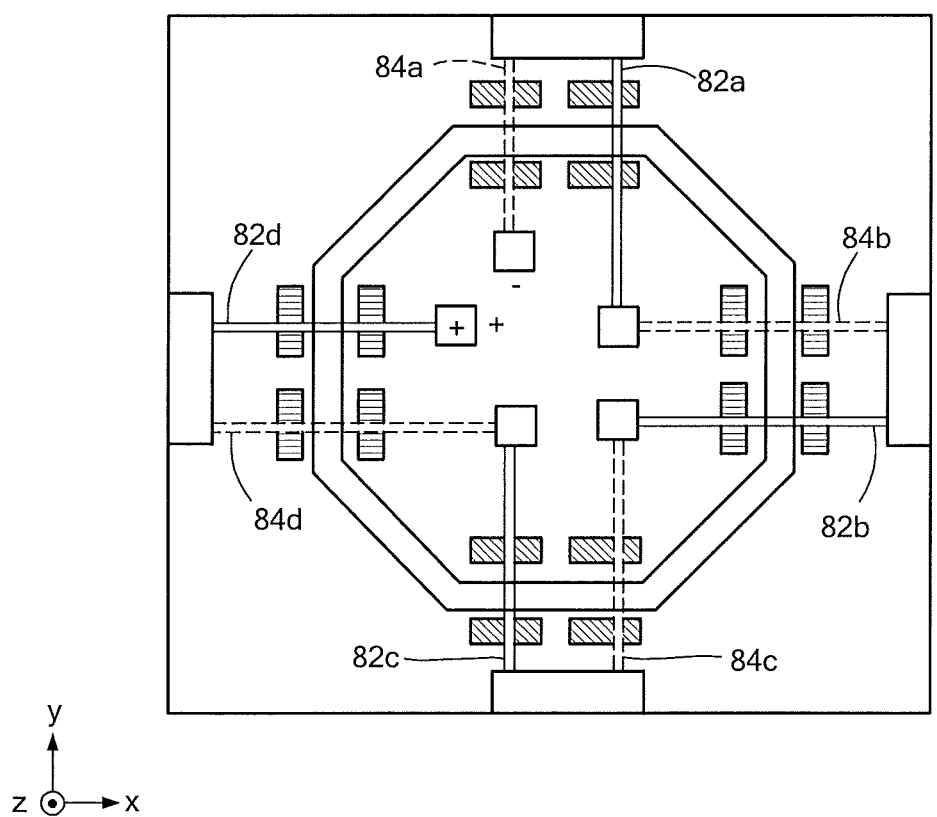
FIG. 8 shows a diagrammatic plan view of a set/reset coil used with the GMR and TGMR sensors.

The magnetization structure of the bottom-pinned GMR or TGMR unit 20a shown in FIG. 2A will be discussed in conjunction with FIG. 3. The magnetization of the pinned layer 24 illustrated by arrow 28 is set to be perpendicular to the longer sides 13 of units 14, 15, while the magnetization of the free layer 22 illustrated by symbols 29 is parallel to the longer sides 13 and perpendicular to the magnetization of the reference layer 26 illustrated by arrow 21, as defined by its shape anisotropy. The direction of the magnetization in the free layer 22 is defined by a set/reset coil 80 as shown in FIG. 8 described in greater detail below. The magnetization of the layers of the unit shown in FIG. 2B is similar as described for FIG. 2A.

In one embodiment, the magnitude of the magnetic moment of the pinned layer 24 is lower than the magnitude of the magnetic moment of the reference layer 26. As a result, the magnetization 21 of the reference layer 26 will align parallel with an applied external field (H) having a specified field strength, while the magnetization 28 of the pinned layer 24 will be aligned anti-parallel to the applied field (H).

Figure 4A:
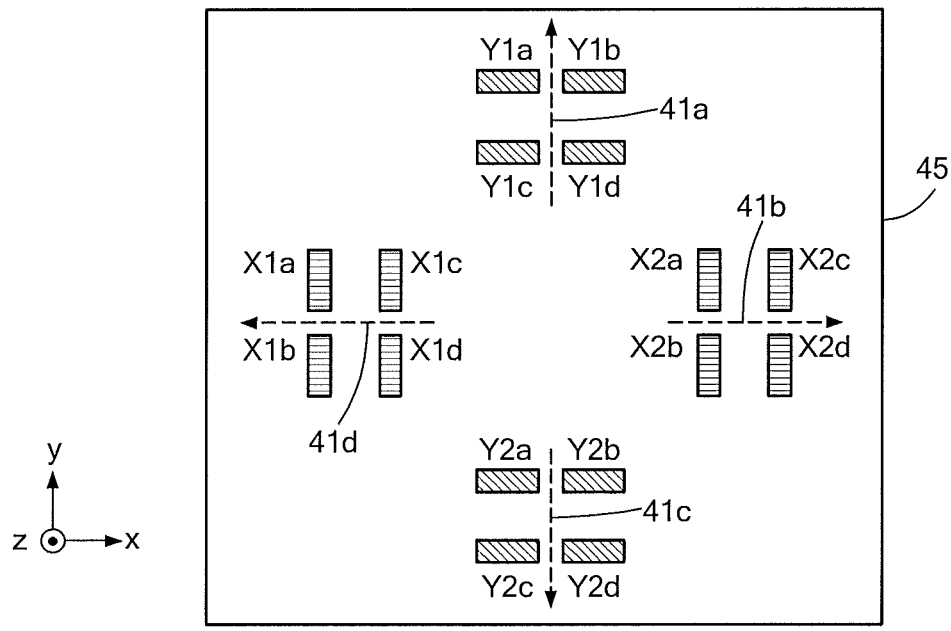
FIG. 4A shows a diagrammatic plan view of the direction of external magnetic fields used to set the antiferromagnetic layer in the GMR and TGMR sensors shown in FIGS. 1A and 1B.
Figure 4B:
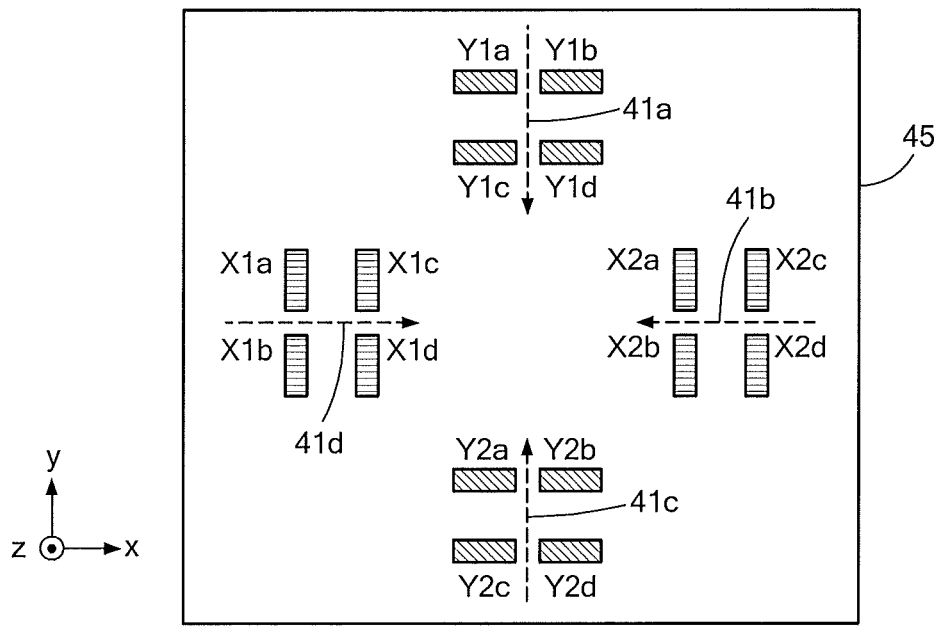
FIG. 4B shows a diagrammatic plan view of alternative directions of external magnetic fields used to set the antiferromagnetic layer in the GMR and TGMR sensors shown in FIGS. 1A and 1B.

Referring to FIG. 4A and FIG. 4B, a localized magnetic field 41a-41d is applied discretely to each sensor group 11, 12 to set the pinning direction of the AFM layer 25. The pinning direction of the AFM layer 25 can be pre-set, for example, by applying a localized magnetic field 41a-41d to the sensor units in vacuum after the unit has been heated to a pre-established temperature. The field direction of the external magnetic field is oriented either from the center of the device 20 outwardly to the four edges 45 as shown in FIG. 4A, or inwardly from the four edges 45 towards the center of the device 20 as shown in FIG. 4B.

Figure 4C:
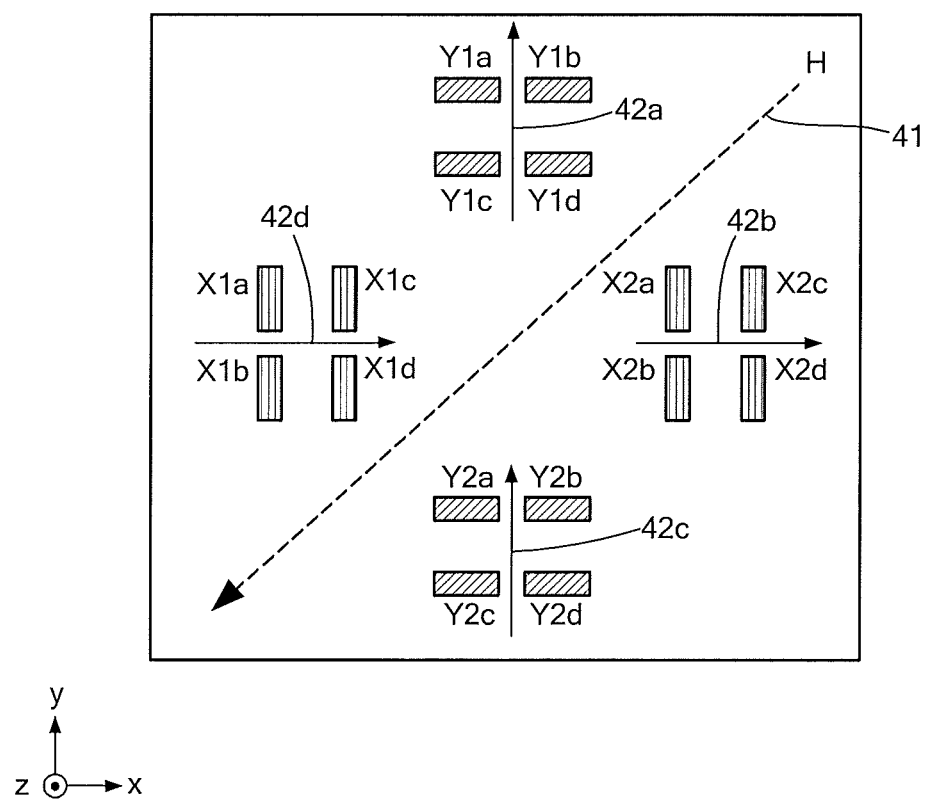
FIG. 4C shows a diagrammatic plan view of directions of a "spin flop" transition with a transversely applied external magnetic field to set the antiferromagnetic layer in the GMR and TGMR units shown in FIGS. 1A and 1B.
Figure 4D:
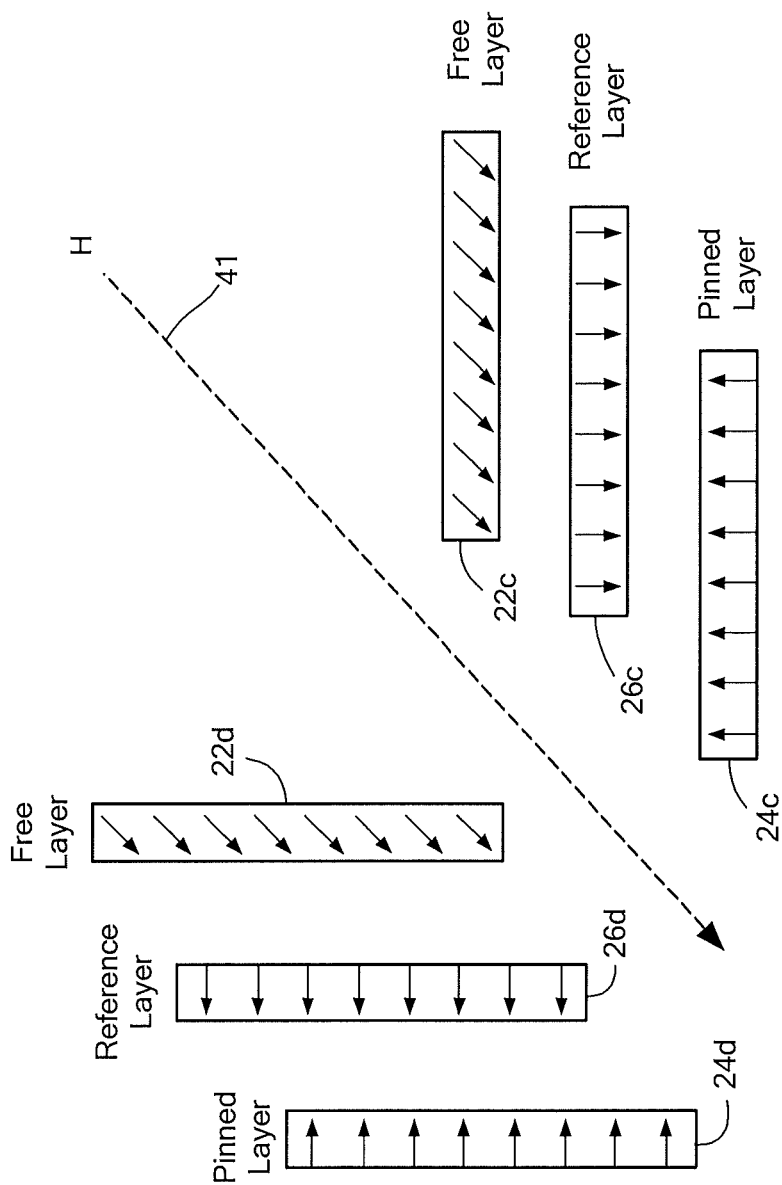
FIG. 4D shows the layer magnetization principle associated with FIG. 4C.

In FIG. 4C, a localized magnetic field (H) 41 is applied transversely, for example at a 45-degree angle relative to the X direction and/or Y direction, in the XY plane. FIG. 4D shows diagrammatically how the AFM pinning directions 42c and 42d shown in FIG. 4C are set by the applied magnetic field (H) 41. This is referred to as a "spin flop" transition. The effectiveness of the "spin flop" depends on, inter alia, the magnetic field strength of the externally applied magnetic field 41; the difference of the magnetic moments between pinned layers 24c, 24d and reference layers 26c, 26d, which preferably is zero or near zero; the annealing temperature during manufacture, which should occur at a temperature above the AFM blocking temperature; the free layer 22c, 22d moment; and the growth field strength and direction for the free 22c, 22d, pinned 24c, 24d, and reference layers 26c, 26d.

The "spin flop" transition causes the magnetization of the free layers 22c, 22d of a nearly balanced SAF structure to align with the direction of the applied magnetic field 41. Further, the magnetization direction of the reference layers 26c, 26d and of the pinned layers 24c, 24d are anti-parallel and fall along the short axis direction. As is well-known, the AFM layer 25 (FIG. 3) is pinned by the magnetization of the pinned layers 24c, 24d.

Figure 5:
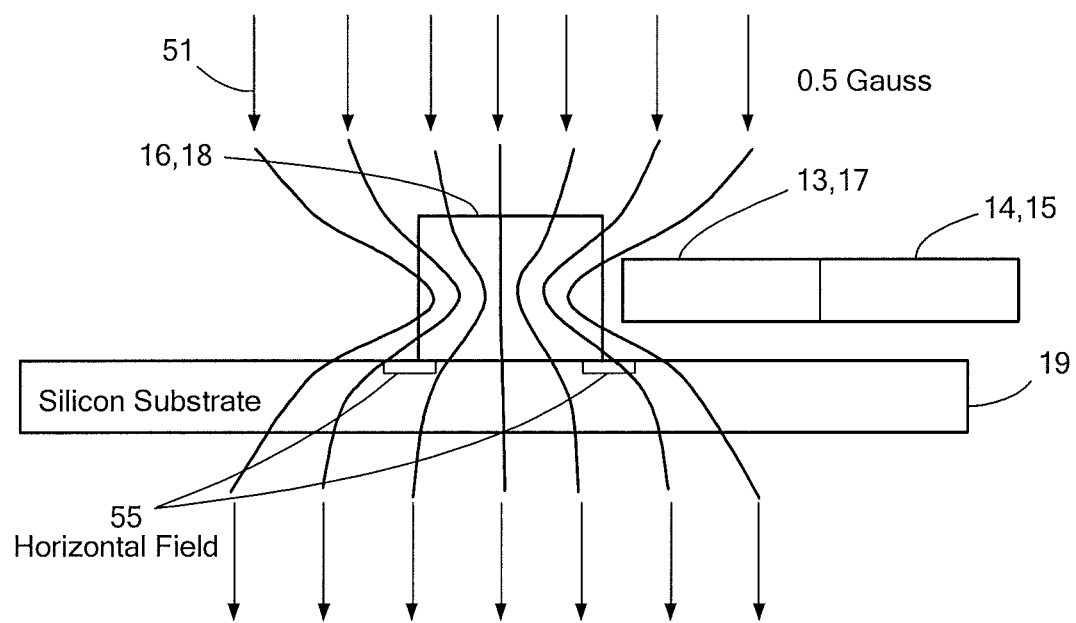
FIG. 5 shows a diagrammatic view of the modification of magnetic flux lines near the magnetic concentrator.
Figure 6B:
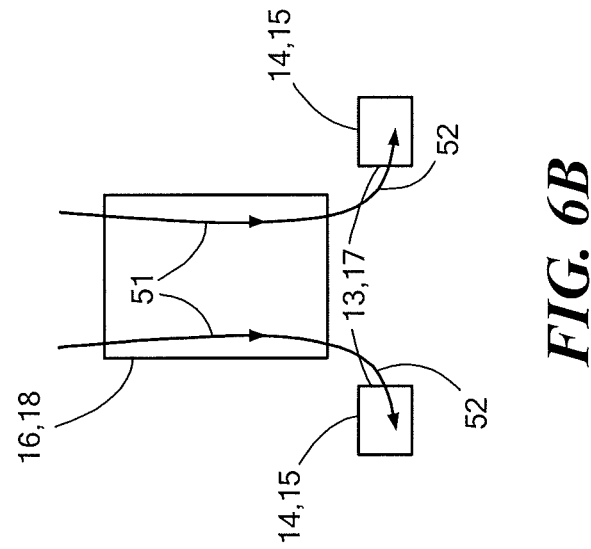
FIGS. 6A and 6B show the working principle of the magnetic concentrator in a perspective view (6A) and in cross-section (6B)
Figure 6A:
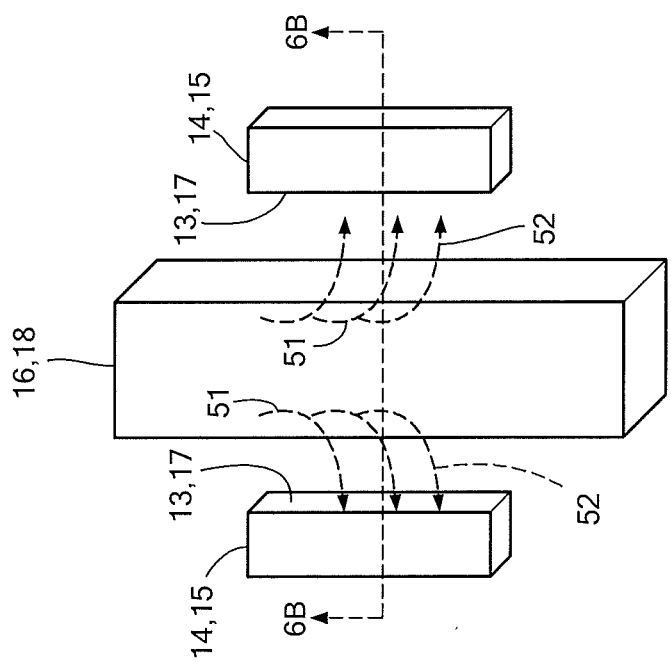

As shown in FIGS. 5-7, the interaction between the magnetic concentrator 16, 18 and units 14, 15, causes an applied magnetic flux 51, oriented orthogonal or substantially orthogonal (vertical) to substrate 19 to be converted to be substantially parallel to the plane of substrate 19 (horizontal) as shown by the arrows 52 in FIG. 6A and FIG. 6B. The field strength is typically 0.5 Gauss in one embodiment The horizontal flux 52 can then be sensed by units 14, 15 that are disposed on both sides of the magnetic concentrator 16, 18. The units 14, 15 generate signals of the sensed magnetic field 52 and which signals are directed to a processing device (not shown) for signal processing as known in the art.

Figures 7A, 7B:
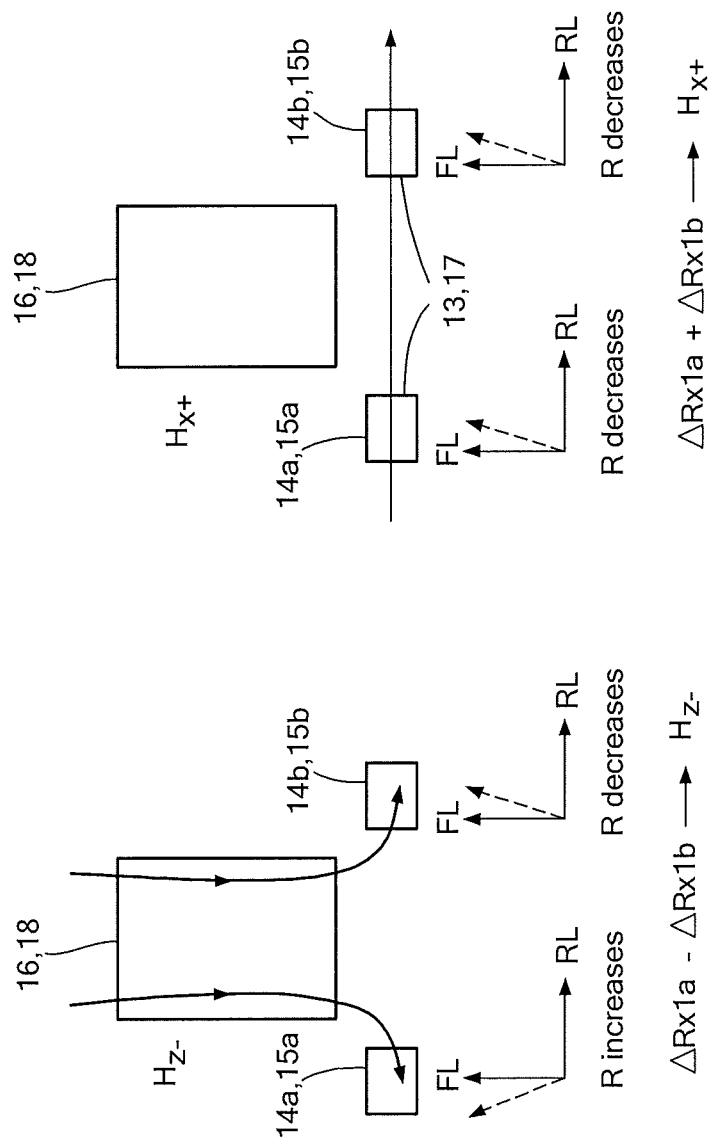
FIGS. 7A and 7B show the working principle of the magnetic concentrator in plan view (7A) and in cross-section (7B)

FIG. 7A illustrates the vertical signal detection (Hz−) using units 14, 15 of respective groups 11, 12. FIG. 7B illustrates the horizontal signal detection (Hx+) using units 14, 15 of respective groups 11,12. As shown in FIG. 7A, the mathematical difference between the sensed fluxes at the unit 14a, 15a to the left of the magnetic concentrator 16, 18 and at the unit 14b, 15b to the right of the concentrator represents the vertical flux (both direction and strength). Similarly, as shown in FIG. 7B, the mathematical sum of the sensed fluxes represents the horizontal flux (both direction and strength). Thus, the magnetic concentrator 16, 18 causes groups 12 having their longer sides 13 parallel to the Y axis to be XZ plane sensors, and groups 11 having their longer sides 13 parallel to the X axis to be YZ plane sensors.

A set/reset coil arrangement for initiating, setting, and resetting the magnetization directions of the free layer 22 and the magnetic concentrator 16, 18 is shown in FIG. 8. The solid lines 82a-82d correspond to set wires that are disposed above the magnetic concentrator 16, 18 while the dashed lines 84a-84d correspond to reset wires that are disposed below the magnetic concentrator 16, 18. Current passing through the wires 82, 84 induces magnetic fields which can be used to establish free layer magnetization directions, e.g., two directions in each group 11, 12, as well as to establish the magnetization in the concentrator 16, 18. With multiple groups of sensing units for the XZ plane sensor and multiple groups of sensing units for the YZ plane sensor, it is possible to acquire a differential signal for Z from one of the sensing units and a sum signal for X or Y from another of the sensing units.

Although preferred embodiments of the invention have been described above, it will be recognized and understood that various modifications may be made in the invention and that the appended claims are intended to cover all such modifications which fall within the spirit and scope of the invention.

What is claimed is:

1. A multi-axis magnetic field sensor comprising:
a substrate;
a first plurality of magnetoresistive sensing units disposed on the substrate and adapted to sense a magnetic field in an x-direction;
a second plurality of magnetoresistive sensing units disposed on the substrate and adapted to sense a magnetic field in a y-direction that is orthogonal to the x-direction; and
a magnetic concentrator having an inner portion and an outer portion, the concentrator disposed on the substrate so that at least one sensing unit from each of the first and the second pluralities of sensing devices is disposed adjacent to, and within, the inner portion and at least one sensing unit from each of the first and the second pluralities of sensing devices is disposed adjacent to, and within, the outer portion;
wherein the magnetic concentrator is operative to convert a magnetic field in a z-direction that is orthogonal to both the x-direction and the y-direction into a magnetic field in an xy-plane.

2. The magnetic field sensor of claim 1 wherein each of the sensing units is a GMR or a TGMR sensor unit.

3. The magnetic field sensor of claim 1 wherein the concentrator is circular.

4. The magnetic field sensor of claim 1 wherein the concentrator is octagonal.

5. The magnetic field sensor of claim 1 wherein the sensing units are each rectangular and have a longer side parallel to the x-direction or the y-direction.

6. The magnetic field sensor of claim 2 wherein each of the sensing units includes a multi-layer structure having an anti-ferromagnetic layer, a pinned layer, a ruthenium layer, a reference layer, and a free layer.

7. The magnetic field sensor of claim 6 further including a set coil and a reset coil disposed, respectively, above and below the concentrator and operative to, respectively, set and reset the magnetization directions of the free layers of the sensing units and of the concentrator.

8. A magnetic field sensor comprising:
a planar substrate, wherein virtual orthogonal co-planar X and Y axes are defined as being in an XY plane that is co-planar with the planar substrate and a virtual Z axis is defined as being orthogonal to the XY plane;
a substantially planar magnetic concentrator disposed on the planar substrate, the magnetic concentrator configured to convert a magnetic field in the Z axis into a magnetic field in the XY plane and the concentrator configured to define an inner region and an outer region of the planar substrate;
a first plurality of magnetoresistive sensing units disposed on the substrate adjacent the concentrator, each unit having a long axis aligned with the Y axis, and each unit configured to sense a magnetic field in the X axis; and
a second plurality of magnetoresistive sensing units disposed on the substrate adjacent the concentrator, each unit having a long axis aligned with the X axis, and each unit configured to sense a magnetic field in the Y axis,
wherein at least one sensing unit from each of the first and the second pluralities is disposed in the inner region and at least one sensing unit from each of the first and the second pluralities is disposed in the outer region.

9. The magnetic field sensor of claim 8, wherein the sensing units in the first and second pluralities are configured as respective first and second Wheatstone bridge circuits.

10. The magnetic field sensor of claim 8, further comprising:
a third plurality of magnetoresistive sensing units disposed on the substrate adjacent the concentrator, each unit having a long axis aligned with the Y axis, and each unit configured to sense a magnetic field in the X axis; and
a fourth plurality of magnetoresistive sensing units disposed on the substrate adjacent the concentrator, each unit having a long axis aligned with the X axis, and each unit configured to sense a magnetic field in the Y axis,
wherein at least one sensing unit from each of the third and the fourth pluralities is disposed in the inner region and at least one sensing unit from each of the third and the fourth pluralities is disposed in the outer region.

11. The magnetic field sensor of claim 8, wherein each of the sensing units is a multilayer structure comprising:
an anti-ferromagnetic layer;
a pinned layer having a magnetization that is set to be perpendicular to the respective long axis;

a ruthenium layer;
a reference layer; and
a free layer.

12. The magnetic field sensor of claim 11, further comprising:
a set/reset structure configured to alter a magnetization direction of the free layer and a magnetization direction of the concentrator.

13. The magnetic field sensor of claim 12, wherein the set/reset structure comprises:
a first set of wires disposed on one side of the concentrator; and
a second set of wires disposed on another side of the concentrator.

14. A method of measuring a magnetic field in three axes, the method comprising:
providing a planar substrate;
disposing a substantially planar magnetic concentrator on the planar substrate, the concentrator positioned to define an inner region and an outer region on the planar substrate;
defining a virtual XY plane, co-planar with the planar substrate, having virtual orthogonal co-planar X and Y axes defined therein and a virtual Z axis that is defined as being orthogonal to the XY plane;
converting an applied magnetic flux oriented in the Z axis to a magnetic flux substantially parallel to the XY plane by operation of the magnetic concentrator;
measuring the magnetic flux along the X axis at a location in the inner region to obtain a first x-flux value;
measuring the magnetic flux along the X axis at a location in the outer region to obtain a second x-flux value; and
obtaining a value representing the magnetic flux in the Z axis by determining a difference between the first and second x-flux values.

15. The method of claim 14, further comprising:
obtaining a value representing the magnetic flux in the X axis by summing the first and second x-flux values together.

\* \* \* \* \*